June 15, 1965 G. STRULL 3,189,800

MULTI-REGION TWO-TERMINAL SEMICONDUCTOR DEVICE

Filed Dec. 14, 1959 2 Sheets-Sheet 1

WITNESSES

Edwin E. Bassler

Charles L. Menzemer

INVENTOR

Gene Strull

BY

Frederick Shapoe

ATTORNEY

MULTI-REGION TWO-TERMINAL SEMICONDUCTOR DEVICE

Filed Dec. 14, 1959 2 Sheets-Sheet 2

3,189,800
MULTI-REGION TWO-TERMINAL SEMICONDUCTOR DEVICE

Gene Strull, Pikesville, Md., assignor to Westinghouse Electric Corporation, East Pittsburgh, Pa., a corporation of Pennsylvania Filed Dec. 14, 1959, Ser. No. 859,191
9 Claims. (Cl. 317—235)

This invention relates generally to a semiconductor device and more specifically to a multi-region, two-terminal monolithic, semiconductor device structure.

In setting forth the teachings of this invention "a layer" of a semiconductive material will be understood to comprise a volume of a semiconductive material having opposed faces and being comprised of at least one region. "A region" is a homogeneous portion of a layer having the same type of semiconductivity.

An object of the present invention is to provide a three layer multi-region, two-terminal monolithic semiconductor structure wherein minority carriers traverse more than three regions.

A still further object of the invention is to provide a monolithic semiconductor device comprising at least three layers of semiconductor material and more regions than the number of layers, including a floating region of opposite conductivity type to the conductivity of a base layer, said floating region providing for the collection and reinjection of minority carriers, whereby the monolithic device enables the obtaining of complex circuit functions otherwise obtainable only by a multiplicity of individual conventional semiconductor devices.

Another object of the present invention is to provide a three layer, multi-region two-terminal, monolithic structure capable of functioning as a combined hyperconductive, negative resistance semiconductor element and a transistor.

Still another object of the present invention is to provide a three layer multi-region, two-terminal monolithic, semiconductor multifunction oscillator device.

Other objects will, in part, appear hereinafter and will, in part, be obvious.

For a better understanding of the nature and objects of the invention, reference should be had to the following detailed description and drawings, in which.

Figure 4:
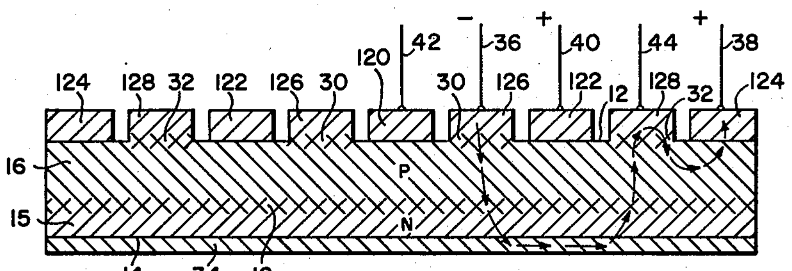
Figure 5:
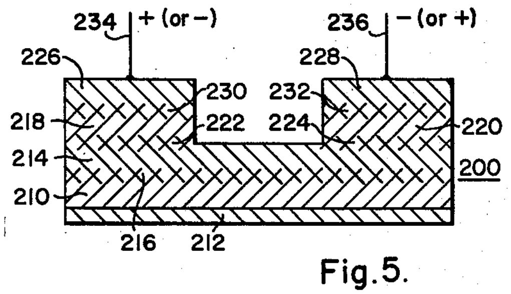
Figure 6:
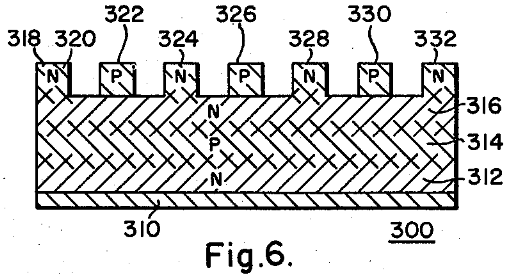
Figure 7:
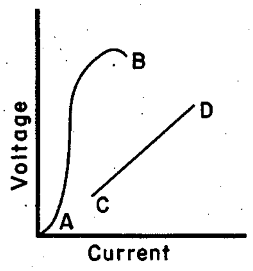

FIGS. 4 to 6 inclusive are side views, in cross section, of multi-region two-terminal semiconductor devices of this invention;

FIG. 7 is a graphical presentation of the first-quadrant I–V characteristics of the semiconductor device of this invention.

Figure 8:
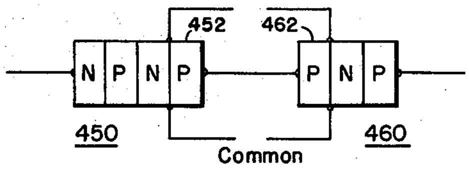
Figure 9:
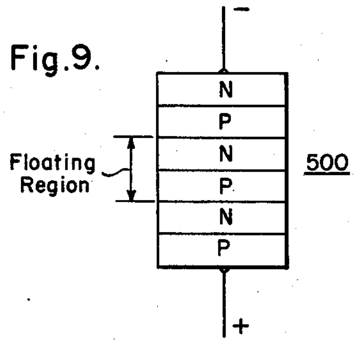

FIG. 8 is a schematic drawing of a diode and a transistor connected in series; and FIG. 9 is a schematic view of a six region semiconductor device.

In accordance with the present invention and attainment of the foregoing objects, there is provided a three or more layer, multi-region, two-terminal monolithic semiconductor device comprising, (1) a centrally disposed layer of semiconductor material having a first-type of semiconductivity and constituting a first region, (2) a lower layer of semiconductor material of a second-type of semiconductivity and comprising a second region, the upper surface of the lower layer being contiguous and substantially coextensive with the bottom surface of the centrally disposed layer, (3) a layer of an electrically conductive material contiguous with the bottom surface of said lower layer, (4) at least one upper layer of a semiconductor material disposed upon and contiguous with the upper surface of the centrally disposed layer, one or more of the upper layers, and including at least the uppermost layers, comprising a plurality of regions, at least the lower layer of the device being a floating region, and (5) electrical contact means with at least any two of the remaining regions, so that the floating region provides for the collection and reinjection of minority carriers when a voltage is applied through the electrical contact means.

For the purpose of clarity, the present invention will be described specifically in terms of preparing a three layer, N–P–N–P–N–P multi-region silicon device. It will, however, be understood that the invention is applicable in a similar manner to the production of other semiconductor devices having three or more layers and more regions than layers, one of said regions being a floating region. The semiconductive material employed in the preparation of the device of this invention may be silicon, germanium, silicon carbide or a stoichiometric compound comprised of elements from Group III of the Periodic Table, for example, gallium, aluminum, and indium, and elements from Group V of the Periodic Table, for example, arsenic, phosphorus, and antimony. Examples of suitable III–V stoichiometric compounds include gallium arsenide, gallium antimonide, indium arsenide, and indium antimonide.

Figure 1:
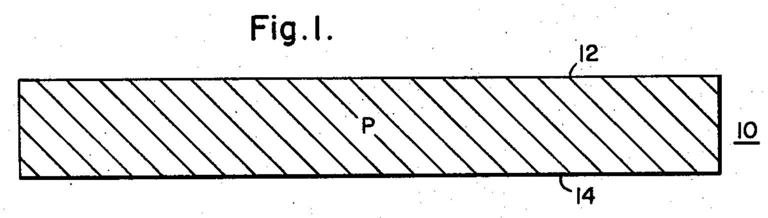
FIGURE 1 is a side view, in cross section, of a wafer of semiconductive material suitable for use in accordance with the teachings of this invention.

With reference to FIGURE 1, there is illustrated a single crystal silicon wafer 10 of P-type semiconductivity. The wafer 10 may be prepared by any of the methods known to those skilled in the art. For example, a single crystal silicon rod may be pulled from a melt comprised of silicon and at least one element from Group III of the Periodic Table, for example, boron, aluminum, gallium and indium. The wafer 10 is then cut from the rod with, for example, a diamond saw. It may be circular, rod shaped, rectangular or of other geometry in cross section. For illustration, wafer 10 is of circular cross section. The surfaces of the wafer may then be lapped or etched or both to produce a smooth surface after sawing. The wafer 10 should be preferably doped to a concentration of from $10^{14}$ to $10^{18}$ carriers per cubic centimeter of silicon. The wafer 10 should have a resistivity within the range of from approximately 0.1 ohm-centimeter to 10,000 ohm-centimeters. The wafer 10 has a top surface 12 and a bottom surface 14 which normally will be parallel, however they may be inclined or otherwise be non-parallel. The wafer 10 may be a segment of a dendritic crystal prepared in accordance with U.S. patent application Serial No. 844,288, filed October 5, 1959, the assignee of which is the same as that of the present invention.

The wafer 10 is then disposed in a diffusion furnace. The hottest zone of the furnace is at a temperature within the range of 1000° C. to 1250° C. and has an atmosphere of the vapor of a donor doping material, for example, phosphorus, arsenic, or antimony. The zone of the furnace within which a crucible of said donor impurity lies may be at a temperature of from 200° C. to 1250° C., the specific temperature being chosen to ensure the desired vapor pressure and surface concentration of diffusant from the crucible. The donor impurity diffuses into the bottom surface 14 of the P-type crystal 10. Since the donor impurity will normally diffuse through all sides of the wafer it will be necessary to mask the sides and top or other surfaces, with for example, an unreactive metal layer, or an oxide layer or the like, through which no diffusion can take place. In the alternative, the diffusant may be allowed to penetrate through all the sides or surfaces of the wafer, and then the undesired doped portions removed from the wafer by cutting, abrading or etching or a combination thereof.

Figure 2:
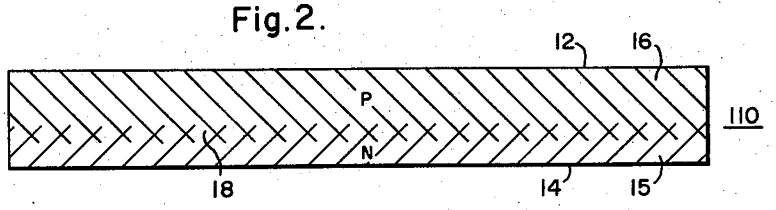
FIG. 2 is a side view, in cross section, of the wafer of FIG. 1 undergoing treatment in accordance with the teachings of this invention.

With reference to FIGURE 2, there is illustrated a wafer 110 which is the P-type wafer of FIGURE 1 after diffusion in which doping impurities have diffused into only the bottom surface 14 of the wafer. The wafer 110 is comprised of a top P-type region 16, a bottom N-type region 15, and a P–N junction 18 disposed between regions 15 and 16. It will be understood that region 15 may also be prepared by the alloy fusion technique, wherein a foil of a metal such as gold or silver with an N-type doping material is placed on surface 14 and heated until fusion and alloying occurs.

In preparing a four-layer device, at least one of the interior regions disposed within the wafer must be formed by vapor diffusion.

P-type region 16 must be deep enough to permit the diffusion or alloying of additional contacts thereto without penetration through to the N-type region 15. The P-type region 16 should not be so deep however as to substantially increase the forward voltage drop of the finished semiconductor device. A preferred depth or thickness is from 0.5 mil to 5 mils, and in particular about 1 mil for P-type region 16 has been found highly satisfactory for the device of this modification of the invention.

Figure 3:
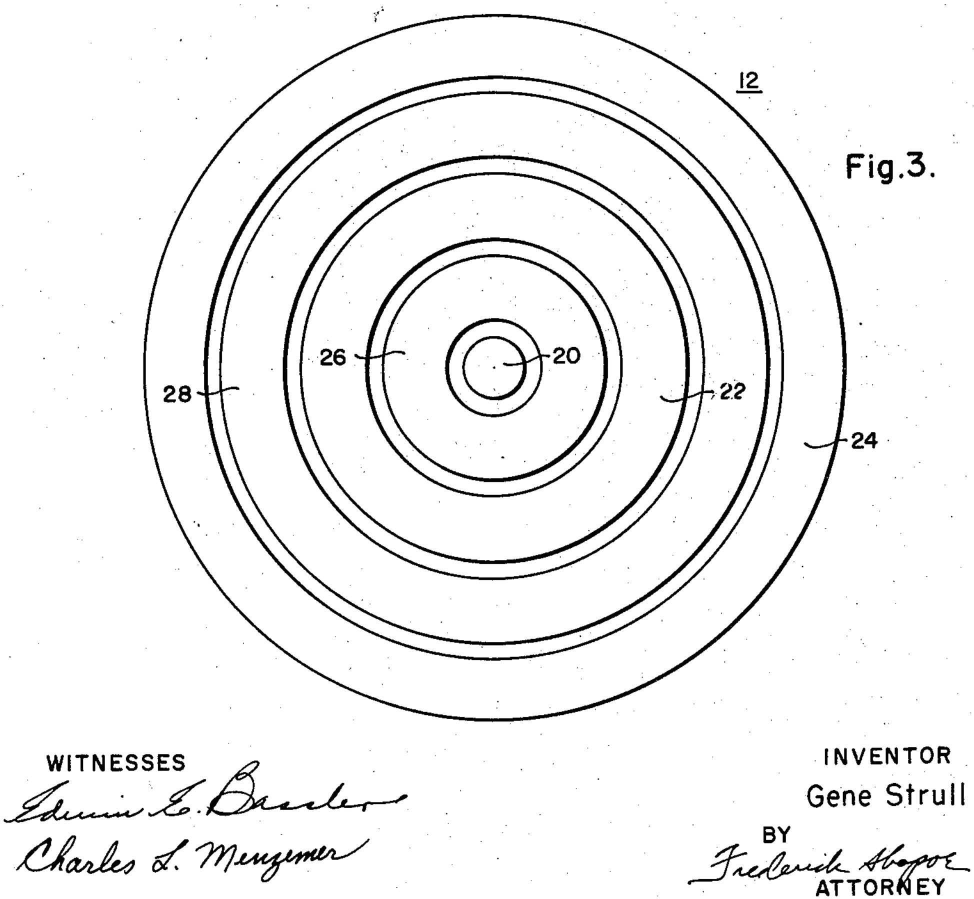
FIG. 3 is a top view of the wafer of FIG. 1 undergoing treatment in accordance with the teachings of this invention.

With reference to FIGURE 3, a P-type doping pellet 20 and P-type doping ring-shaped foils 22 and 24 comprised of an acceptor doping alloy are disposed upon top surface 12 of the wafer 110. The pellet 20 is disposed centrally on the top surface 12 of the wafer 110. The foil 24 is disposed on the top surface 12 of the wafer 110 so that its periphery does not extend beyond and preferably is well within the outer periphery or edge of wafer 110. The foil 22 is disposed upon the top surface 12 of the wafer 110 essentially midway between pellet 20 and foil 24.

The pellet 20 and the foils 22 and 24 are comprised of an acceptor doping material or alloy comprised of at least one element, or alloys or mixtures of elements from Group III of the Periodic Table such as boron, aluminum, gallium and indium, or alloys or mixtures of elements from Group III of the Periodic Table and a neutral metal, for example, gold, capable of establishing a P(+)-type semiconductive region within region 16 when fused therewith. That is, the P-type acceptor doping material of pellet 20 and foils 22 and 24 must be capable of combining with the material of P-type region 16 to form a region having a concentration of from $10^{17}$ to $10^{20}$ carriers per cubic centimeter of silicon. Examples of suitable alloys include a 98 to 99.9% gold-boron alloy and a gold-boron-bismuth alloy comprising up to 1% bismuth and 0.1 to 2% boron. The criterion for selection of a suitable doping material being the ability of the material to form a region having the required concentration of carriers.

In addition, ring-shaped foils 26 and 28 comprised of a donor doping material or alloy are disposed upon the top surface 12 of the wafer 110. The N-type donor doping foil 26 is disposed substantially centrally between the P-type acceptor doping pellet 20 and the P-type acceptor doping foil 22. The N-type donor doping foil 28 is disposed substantially centrally betweeen the P-type acceptor doping foil 22 and P-type acceptor doping foil 24. In all cases a substantial space separates rings 20, 22, 24, 26 and 28 from each other and pellet 20 so that short-circuiting does not occur.

The N-type donor doping foils 26 and 28 are comprised of at least one element, or alloys or mixtures of neutral metals embodying elements from Group V of the Periodic Table capable of establishing an N-type region of semiconductivity within a portion of P-type region 16 when fused therewith. Examples of suitable Group V elements which can be employed alone or in combination include phosphorus, arsenic and antimony. The N-type foils 26 and 28 may be comprised of an alloy of at least one element from Group V of the Periodic Table and a relatively neutral metal, for example gold. Examples of suitable alloys include 98 to 99.9% gold-arsenic alloy and a 98 to 99.9% gold-antimony alloy.

It will be understood that a jig or other type of apparatus comprised of an inert material, for example graphite, may be used to aid in the positioning of the pellet and the foils on surface 12 of the wafer 110.

The pellet 20 and the foils 22, 24, 26 and 28 are fused to the top surface 12 of the wafer 110 by heating in a fusion furnace having a vacuum or inert atmosphere, for example a vacuum of $10^{-2}$ to $10^{-5}$ mm. Hg or an argon or helium atmosphere at a temperature of from 650° C. to 750° C. Care must be taken during the fusion step to ensure that the pellet 20 and the foils 22, 24, 26 and 28 do not fuse and penetrate entirely through the P-type region 16 and contact the N-type region 15.

With reference to FIGURE 4, there is illustrated the wafer 110 of FIGURE 2 after the fusion of the pellet 20 and the foils 22, 24, 26 and 28 to the top surface 12 of the wafer. The wafer now is comprised of a P-type region 16, an N-type region 15, and the P–N junction 18 between regions 15 and 16. In addition, there is now a third layer comprising the fused pellet 20 and concentric rings 22, 24, 26 and 28. A P(+) region 120 is disposed centrally upon the top surface 12 of the wafer. An N-type region 126 is disposed circumferentially around the P-type region 120. There is a P–N junction 30 between N-type region 126 and P-type region 16. There is a P(+)-type region 122 disposed circumferentially about N-type region 126. There is an N-type region 128 disposed circumferentially about P(+)-type region 122. A P–N junction 32 exists between N-type region 128 and P-type region 16. A P(+)-type region 124 is disposed circumferentially at the periphery of top surface 12 of the wafer.

During fusion of the pellet 20 and the foils 22, 24, 26 and 28 to the wafer a highly conductive contact layer 34 is fused, soldered, brazed or otherwise joined to the bottom surface 14 of the wafer. The highly conductive contact 34 may be comprised of any highly conductive neutral metal or alloy, for example gold, silver, and lead or alloys and mixtures thereof. In addition to being comprised of a highly conductive metal, the contact 34 may be a highly degenerate semiconductor region having the same type of semiconductivity as the region in which it is in contact. The highly conductive layer is necessary to provide reflection of minority carriers during operation of the device.

The structure is comprised of a central layer, which consists entirely of P-type region 16, a bottom layer which consists entirely of N-type region 15, and a top layer which is comprised of P(+) regions 120, 122 and 124 and N-type regions 126 and 128. The highly conductive contact 34 is joined to region 15. Leads 36, 38, 40, 42 and 44 may be joined to each of the P and N regions of the top layer. However, only two leads are used at any one time. The leads may be pressure contacts or may be soldered or joined permanently.

The structure illustrated in FIGURE 4 is a three layer, multi-region semiconductor device which functions as a combined hyperconductive negative resistance semiconductor element and a transistor formed in a monolithic structure when any two leads are attached to any two non-adjacent regions of opposite conductivity.

The structure of FIGURE 4 is capable of several modes of operation. For example, if only leads 36 and 38 are connected to a voltage source, N-type region 126 is biased negatively through the electrical contact or lead 36 with regard to P(+) region 124 which is biased positively through an electrical contact or lead 38 and the highly conductive contact layer 34 is not externally energized electrically, carriers injected by region 126 into region 16 are collected by region 15 and conveyed through contact layer 34, re-emitted from layer 34 and region 15 through region 16, collected by region 128 and re-emitted back to region 16, and passes into an external circuit through region 124 via the positively biased contact 38. The arrows in FIG. 4 show this path taken by the minority carriers. This mode of operation provides the same effect and result as that of a six region N–P–N–P–N–P device.

In still another mode of operation of the device of FIGURE 4, contact is made between the negatively biased region 126 through the electrical contact 36 and the positively biased region 122 through an electrical contact 40. When such contact is made the device exhibits a characteristic common to a four region structure. In such a mode of operation use is made of reflection from the floating region provided by the junction between region 15 and contact layer 34. Accordingly, the device illustrated in FIG. 4 is capable of many modes of operation. If contact is made between two adjacent regions, in the top layer, the device will operate as a four-region device. If contact is made between two non-adjacent regions of opposite type semiconductivity, in the top layer, the device will operate as a six region device. This use may be intermittent from one to the other. Thus, several separate circuits may be controlled from one device.

When using the structure of FIGURE 4 as a six region device, operation of variable pulse width and repetition rate are obtained having separate hyperconductive negative resistance transistor combination characteristics. In addition, due to feedback and parallel paths within the monolithic structure of the device of this invention a wave shape approaching a sine wave may be readily generated.

The monolithic semiconductor device of FIGURE 4 is capable with proper bias of putting out saw tooth pulses and, by means of bias applied between two inner regions, it is possible to vary the width and repetition rate of the pulses generated.

With reference to FIG. 5, there is illustrated a four layer, seven region device 200. The device 200 may be prepared in accordance with the procedure set forth hereinabove for preparing the device of FIG. 4, and may be prepared utilizing any of the semiconductor materials, doping materials and contact materials described as suitable in the abovementioned description.

The device 200 is comprised of a bottom layer which consists entirely of an N-type region 210. A metal contact layer 212 is applied to the bottom surface of the N-type region 210. A second layer is disposed upon the top of, and is contiguous and coextensive with the bottom layer. This second layer consists entirely of a P-type region 214. There is a P–N junction 216 between regions 210 and 214. A third layer is disposed on top of, and is contiguous with the top surface of the second layer. The third layer consists of N-type regions 218 and 220. A P–N junction 222 exists between regions 214 and 218 and a P–N junction 224 exists between regions 214 and 220. A fourth layer is disposed on top of the third layer. The fourth layer is comprised of P-type regions 226 and 228. There is a P–N junction 230 between regions 218 and 226 and a P–N junction 232 between regions 220 and 228. Electrical contacts 234 and 236 are joined by soldering or the like to the regions 226 and 228, respectively.

In one mode of operation, minority carriers are injected for example into region 228, which is biased negative relative to region 226. The minority carriers pass through regions 228, 220, 200 and are collected and reinjected by region 210. The minority carriers reinjected by region 210 pass through regions 200, 218 and 226. The carriers pass from region 226 into the external circuit. The collection and reinjection of minority carriers is a result of the fact that layer 210 associated with layer 212 floats electrically. The mode of operation of the device 200 is the same as a seven region P–N–P–N–P–N–P device.

With reference to FIG. 6, there is illustrated a four layer, seven region device 300. The device 300 is similar to the device of FIG. 4 except it has an additional layer. A highly conductive contact 310 is affixed to the bottom surface of the N-type bottom layer 312. As pointed out above, the contact 310 may be a metal or a highly degenerate semiconductor region and makes possible the collection and reinjection of minority carriers by collector region 312. Layer 314 is a P-type region, while layer 316 is an N-type region. Layer 318 comprises separate N-regions 320, 324, 328 and 332 and P-regions 322, 326 and 330.

With reference to FIG. 7, there is illustrated the first quadrant I–V characteristic of the device of FIG. 4 and the device of FIG. 5 when regions 320 and 324 are energized. The characteristic curve is a combination of the characteristic curve of a transistor and a two-terminal N–P–N–P hyperconductive semiconductor device. The curve AB is typical of a transistor characteristic, and the curve CD is typical of a two-terminal N–P–N–P device characteristic.

With reference to FIGS. 8 and 9, there is illustrated schematically and in terms of prior art device combinations, the mode of operation described immediately above. Referring to FIGURE 8, if a two-terminal, four-region device 450 and a transistor 460 were connected in series the result would be substantially the same as that described above relative to the device of FIG. 4. If P-type region 452 of the device 450 and P-type region 462 of the transistor 460 were combined to form a common region the resulting device if made into one device would be that illustrated as 500 in FIGURE 9 with one of the central regions being a floating region. The device 500 is a six region N–P–N–P–N–P device.

One skilled in the art will realize the difficulty of attempting to fabricate a six region device of the type illustrated in FIGURE 9. It is obvious that an attempt to form alternate P and N layers in a single wafer of a semiconductor material by alloying or vapor diffusion would be an almost insurmountable task since; (1) it would be extremely difficult is not impossible to control the varying thicknesses of the regions, especially the interior regions; and (2) great difficulty would be experienced in attempting to make contact to the interior P and N regions.

It will be understod that the order of the above steps leading to the formation of the semiconductor devices having various layers and regions incorporating the teachings of this invention is not critical and is set forth hereinabove only for the purposes of illustration. It will be further understood that the fabrication of the plural region layers of these devices, while illustrated above utilizing alloy fusion techniques, can be prepared by the employment of the vapor diffusion techniques. If the latter practice is followed it may be necessary to mask certain predetermined areas on the top surface of the wafer and then diffuse either N or P-type doping materials in the form of a vapor into the wafer. After diffusion, the diffused areas would be suitably masked and the P or N-type impurities would be diffused through the previously masked portions.

The following specific example is illustrative of the practice of this invention.

*Example I*

Each of a series of flat circular wafers of single crystal P-type silicon having a doping concentration of from $10^{13}$ to $10^{17}$ carriers per cubic centimeter of silicon and a resistivity of from .1 to 1000 ohm centimeters, and having a diameter of one-half inch and a thickness of 5 mils, was coated at its circular edge and top surface with a masking oxide layer. The wafer was then disposed in a diffusion furnace. The diffusion furnace was at a maximum temperature of 1200° C. and had a nitrogen atmosphere. The phosphorus was allowed to diffuse into the bottom surface of the wafer to a depth of 1 mil. The wafer was then removed from the diffusion furnace and the masking layer removed from the circular edge and the top surface.

Thereafter, a pellet having a diameter of 0.090 inch and comprised of 99%, by weight, gold–1%, by weight, boron, and having a thickness of 1 mil, was disposed centrally upon the top surface of the wafer. A foil having an outside diameter of 0.490 inch, an inside diameter of 0.400 inch was disposed around the peripheral edge of the top surface of the wafer. The foil was comprised of 99%, by weight, gold–1%, by weight, boron. Another foil having an outside diameter of .290 inch, an inside diameter of .200 inch and comprised of 99%, by weight, gold–1%, by weight, boron was disposed on the top surface of the wafer centrally between the centrally disposed pellet and the peripherally disposed foil. Another foil having an outside diameter of .190 inch, an inside diameter of .100 inch and comprised of 99%, by weight, gold–1%, by weight, arsenic was disposed on the top surface of the wafer substantially centrally between the centrally disposed pellet and the last-mentioned foil. Another foil having an outside diameter of .390 inch, an inside diameter of .300 inch and comprised of 99%, by weight, gold–1%, by weight, arsenic was disposed substantially centrally between the peripheral foil and the adjacent foil upon the top surface of the wafer. The wafer with the pellet and various foils disposed upon the top surface thereof was then heated to a temperature of approximately 700° C. whereby the pellet and the foils were fused to the wafer.

During the fusion operation a contact layer comprised of 99%, by weight, gold–1%, by weight, antimony having a thickness of 0.0008 inch and a diameter of one-half inch was simultaneously fused to the bottom surface of the silicon wafer.

Ohmic electrical contacts comprised of tin were then fused to each of the several foils and pellet that had been previously fused to the top surface of the wafer.

When the device thus prepared was connected in an external circuit, contact being made between the various foils and pellet which had been fused to the top surface, the multi-function monolithic structure semiconductor device performed in the manner described above. Thus, saw tooth waves of various configuration were produced.

While the invention has been described with reference to particular embodiments and examples it will be understood that modifications, substitutions, and the like may be made therein without departing from its scope.

I claim as my invention:

1. A monolithic semiconductor device comprised of at least three layers of semiconductor material, said layers being divided so that the device is comprised of at least one more region than layers, said layers of semiconductor material being disposed one upon the other, the bottom layer having an electrically conductive contact disposed upon its bottom surface, the top layer being divided into at least one region of first- and at least one region of second-type semiconductivity, a semiconductor transition region between each contiguous region of first and second type of semiconductivity and means for establishing electrical contact with one region of said first-type and one region of said second-type semiconductivity within the top layer.

2. A multi-region, two-terminal monolithic semiconductor device comprising, (1) a first region of a semiconductor material having a first-type of semiconductivity, said first region having a top and a bottom surface, (2) a second region having a second-type of semiconductivity, said second region being coextensive and contiguous with said first region along the bottom surface of said first region, (3) a semiconductor transistion region between said first and said second regions, (4) an ohmic contact disposed upon and contiguous with the other surface of said second region, (5) a plurality of independent and physically isolated regions having the first-type of semiconductivity disposed upon and contiguous with the top surface of said first region, said plurality of first-type semiconductive regions being doped to a higher concentration than said first region, (6) a plurality of independent and physically isolated regions having the second-type of semiconductivity disposed upon and contiguous with the top surface of said first region, said regions being disposed between the aforesaid regions of first-type semiconductivity but physically isolated therefrom, (7) a semiconductor transition region between each of said independent regions of second-type semiconductivity and said first region of first-type semiconductivity, and (8) means for making electrical contact in combination of two's to each of said independent regions of said first-type and said second-type semiconductivity.

3. A monolithic multi-region two-terminal semiconductor device comprising, (1) a first region of a semiconductor material, said semiconductor material being selected from the group consisting of silicon, germanium, silicon carbide, and stoichiometric compounds of Group III and Group V elements of the periodic table, said first region having a P-type of semiconductivity, said first region having a top and a bottom surface, (2) a second region having an N-type semiconductivity, said second region being coextensive and contiguous with said first region along the bottom surface of said first region, (3) a P–N junction between said first and said second region, (4) a plurality of independent and physically isolated P(+)-type regions disposed upon and contiguous with the top surface of said first region, (5) a plurality of independent and physically isolated N-type regions disposed upon and contiguous with the top surface of said first region, said N-type regions being disposed between the aforesaid P(+)-type regions but physically isolated therefrom, (6) *a* P-N junction between each of said N-type independent regions and said P-type first region, and (7) means for making electrical contact in combination of twos to each of said P(+)-type and N-type independent regions.

4. A multi-region monolithic semiconductor device comprising, (1) a first region of silicon, said first region having a first type of semiconductivity, said first region having a top and a bottom surface, (2) a second region having a second-type of semiconductivity, said second region being coextensive and contiguous with said first region along the bottom surface of said first region, (3) a semiconductor transition region between said first and said second regions, (4) an ohmic contact disposed upon and contiguous with the other surface of said second region, (5) a plurality of independent and physically isolated regions having the first-type of semiconductivity disposed upon and contiguous with the top surface of said first region, said plurality of first-type semiconductive regions being doped to a higher concentration than said first region, (6) a plurality of independent and physically isolated regions having the second-type of semiconductivity disposed upon and contiguous with the top surface of said first region, said regions being disposed between the aforesaid regions of first-type semiconductivity but physically isolated therefrom, (7) a semiconductor transition region between each of said independent regions of second-type semiconductivity and said first region of first-type semiconductivity, and (8) means for making electrical contact to each of said independent regions of said first-type of said second-type semiconductivity.

5. A multi-region monolithic semiconductor device comprising, (1) a first region of silicon, said first region having a P-type semiconductivity, said first region having a top and bottom surface, a second region having an N-type semiconductivity, said second region being coextensive and contiguous with said first region along the bottom surface of said first region, (3) a P–N junction between said first and said second region, (4) a plurality of independent and physically isolated P(+)-type regions disposed upon and contiguous with the top surface of said first region, (5) a plurality of independent and physically isolated N-type regions disposed upon and contiguous with the top surface of said first region, said N-type regions being disposed between the aforesaid P(+)-type regions but physically isolated therefrom, (6) a P–N junction between each of said N-type independent regions and said P-type first region, and (7) means for making electrical contacts to each of said P(+)-type and N-type independent regions.

6. A multi-region monolithic semiconductor device comprising (1) a first region of silicon, said first region having a P-type semiconductivity, said first region being doped to a concentration of from $10^{14}$ to $10^{18}$ carriers per cubic centimeter of silicon, said first region having a top and a bottom surface, (2) a second region having an N-type semiconductivity, said second region being doped to a concentration of from $10^{14}$ to $10^{18}$ carriers per cubic centimeter of silicon, (3) a P–N junction between said first and said second region, (4) a plurality of independent and physically isolated P(+)-type regions disposed upon and contiguous with the top surface of said first region, (5) a plurality of independent and physically isolated N-type regions disposed upon and contiguous with the top surface of said first region, said N-type regions being disposed between the aforesaid P(+)-type regions but physically isolated therefrom, (6) a P–N junction between each of said N-type independent regions and said P-type first regions, and (7) means for making electrical contacts to each of said P(+)-type and N-type independent regions.

7. A multi-region monolithic semiconductor device comprising, (1) a first region of germanium, said first region having a first type of semiconductivity, said first region having a top and a bottom surface, (2) a second region having a second-type of semiconducitvity, said second region being coextensive and contiguous with said first region along the bottom surface of said first region, (3) a semiconductor transition region between said first and said second regions, (4) an ohmic contact disposed upon and contiguous with the other surface of said second region, said ohmic contact serving to reflect minority carriers into the second region during operation of the device, (5) a plurality of independent and physically isolated regions having the first-type of semiconductivity disposed upon and contiguous with the top surface of said first region, said plurality of first-type semiconductor regions being doped to a higher concentration than said first region, (6) a plurality of independent and physically isolated regions having the second-type of semiconductivity disposed upon and contiguous with the top surface of said first region, said regions being disposed between the aforesaid regions of first-type semiconductivity but physically isolated therefrom, (7) a semiconductor transition region between each of said independent regions of second-type semiconductivity and said first region of first-type semiconductivity, and (8) means for making electrical contact to each of said independent regions of said first-type and said second-type semiconductivity.

8. A multi-region monolithic semiconductor device comprising, (1) a first region of germanium, said first region having a P-type semiconductivity, said first region having a top and bottom surface, (2) a second region having an N-type semiconductivity, said second region being coextensive and contiguous with said first region along the bottom surface of said first region, (3) a P–N junction between said first and said second region, (4) a plurality of independent and physically isolated P(+)-type regions disposed upon and contiguous with the top surface of said first region, (5) a plurality of independent and physically isolated N-type regions disposed upon and contiguous with the top surface of said first region, said N-type regions being disposed between the aforesaid P(+)-type regions but physically isolated therefrom, (6) a P–N junction between each of said N-type independent regions and said P-type first region, and (7) means for making electrical contacts to each of said P(+)-type and N-type independent regions.

9. A multi-region monolithic semiconductor device comprising (1) a first region of germanium, said first region having a P-type semiconductivity, said first region being doped to a concentration of from $10^{14}$ to $10^{18}$ carriers per cubic centimeter of silicon, said first region having a top and a bottom surface, (2) a second region having an N-type of semiconductivity, said second region being doped to a concentration of from $10^{14}$ to $10^{18}$ carriers per cubic centimeter of silicon, (3) a P–N junction between said first and said second region, (4) a plurality of independent and physically isolated P(+)-type regions disposed upon and contiguous with the top surface of said first region, (5) a plurality of independent and physically isolated N-type regions disposed upon and contiguous with the top surface of said first region, said N-type regions being disposed between the aforesaid P(+)-type regions but physically isolated therefrom, (6) a P–N junction between each of said N-type independent regions and said P-type first regions, and (7) means for making electrical contacts to each of said P(+)-type and N-type independent regions.

References Cited by the Examiner

UNITED STATES PATENTS

| | | | |
|---|---|---|---|
| 2,806,983 | 9/57 | Hall | 317—235 |
| 2,923,870 | 2/60 | Zelinka | 317—235 |
| 2,967,793 | 1/61 | Philips | 148—33 |
| 2,980,832 | 4/61 | Stein et al. | 317—235 |
| 2,985,805 | 5/61 | Nelson | 317—235 |

DAVID J. GALVIN, *Primary Examiner.*

SAMUEL BERNSTEIN, LLOYD McCOLLUM, BENNETT G. MILLER, *Examiners.*